United States Patent
Kobayashi et al.

(10) Patent No.: US 6,778,028 B2
(45) Date of Patent: Aug. 17, 2004

(54) TEMPERATURE-COMPENSATED RADIO-FREQUENCY OSCILLATOR AND COMMUNICATION DEVICE

(75) Inventors: Yoshihiro Kobayashi, Suwa (JP); Nobuyuki Imai, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/281,917

(22) Filed: Oct. 28, 2002

(65) Prior Publication Data

US 2003/0090333 A1 May 15, 2003

(30) Foreign Application Priority Data

Oct. 30, 2001 (JP) ........................................ 2001-333356
Jul. 3, 2002 (JP) ........................................ 2002-194994

(51) Int. Cl.[7] ............................. H03L 7/08; H03L 7/099
(52) U.S. Cl. ............................. 331/17; 331/18; 331/25; 331/66; 455/260

(58) Field of Search ........................... 331/1 A, 17, 18, 331/25, 66, 68–70, 107 A, 176; 327/156–159; 332/127; 360/51; 375/376; 455/260

(56) References Cited

U.S. PATENT DOCUMENTS 4,868,524 A * 9/1989 Costlow et al. ............... 331/16
5,148,122 A * 9/1992 Karlquist ....................... 331/3
6,005,446 A * 12/1999 Galani et al. ................. 331/41

* cited by examiner

Primary Examiner—David Mis
(74) Attorney, Agent, or Firm—Harness, Dickey & Pierce, P.L.C.

(57) ABSTRACT

By supplying a control voltage that corresponds to the phase difference between an output signal of a temperature-compensated crystal oscillator (TCXO 1) and a signal obtained by dividing an output signal of a voltage-controlled SAW oscillator (VCSO 4) using the SAW resonator to the VCSO 4, the frequency of the output signal of the VCSO 4 is controlled so as to be constant over a wide temperature range.

8 Claims, 6 Drawing Sheets

TEMPERATURE-COMPENSATED RADIO-FREQUENCY OSCILLATOR AND COMMUNICATION DEVICE

BACKGROUND OF THE INVENTION

1. Field of the Invention

The present invention relates to a temperature-compensated radio-frequency oscillator that achieves high frequency stability by providing temperature compensation for frequency-temperature characteristics of a SAW resonator.

2. Description of Related Art

An oscillator is mounted on a communication device such as a mobile phone. Such a device performs modulation and demodulation of communication data based on an output signal from the oscillator. Recently, there are demands for a communication device that achieves stable oscillation (high frequency stability) in the radio-frequency band (from several hundred MHz to several GHz) and stable oscillation in the range of practical temperature for the communication device (temperature compensation).

For performing such radio-frequency oscillation, a circuit comprising a crystal AT resonator and a phase locked loop, and a circuit comprising a SAW resonator are used.

However, the above-described circuits are deficient for performing stable radio-frequency oscillation. For example, a communication-error rate is increased when they are mounted on a communication device.

The details of such problems will now be described.

Circuit Comprising Crystal AT Resonator and PLL

Figure 7:
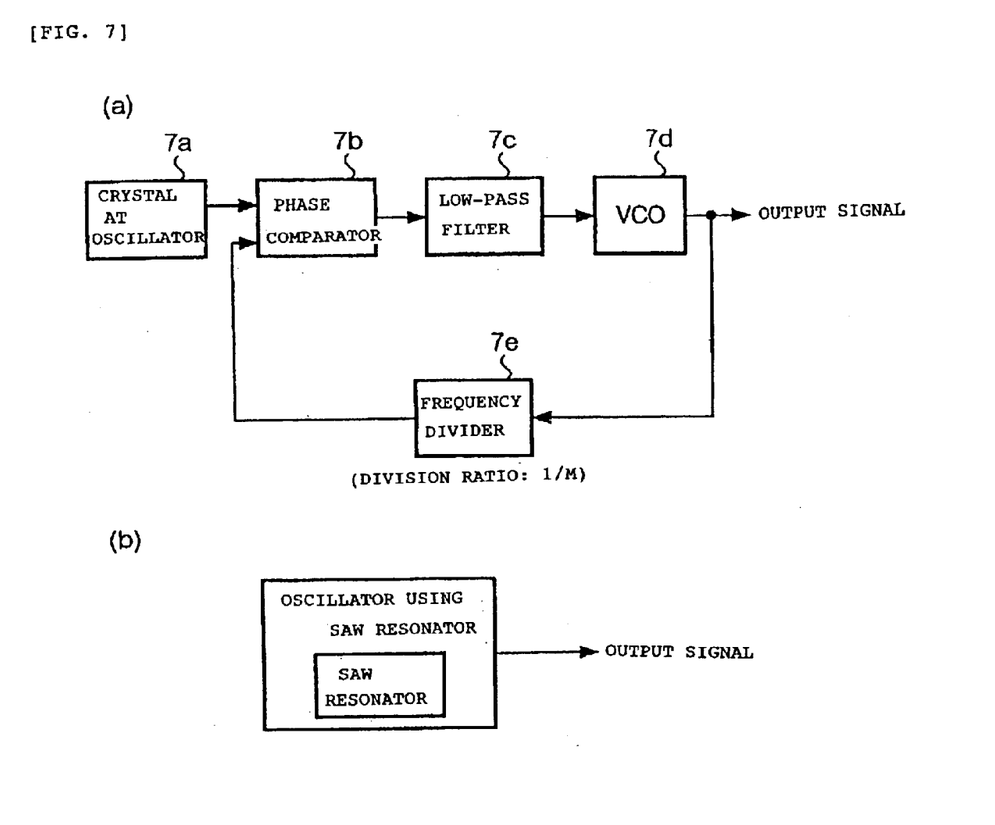

This circuit uses a crystal AT resonator that resonates with stability in the passband from several MHz to a few tens of MHz. FIG. 7($a$) illustrates this circuit. As shown in this drawing, a crystal AT resonator 7$a$, a phase comparator 7$b$, a low-pass filter 7$c$, a VCO 7$d$, and a frequency divider 7$e$ form a PLL circuit. This circuit outputs a signal, obtained by multiplying an oscillated frequency of the crystal AT resonator 7$a$, from the VCO 7$d$, thereby achieving the radio-frequency oscillation.

However, in general, Performance of the phase noise characteristics and the jitter characteristics of a ring oscillator that is used for the VCO 7$d$ for performing radio-frequency output are low. Therefore, Performance of the frequency stability of a signal output from this circuit becomes low.

Circuit Comprising SAW Resonator

A SAW resonator uses the property of energy such that energy is concentrated and propagated near the surface of an elastic body. More specifically, the SAW resonator comprises interdigital excitation electrodes and a ladder reflector that are placed on a piezoelectric substrate. A surface wave that is excited by the excitation electrodes is reflected by the reflector, whereby a standing wave is generated. A resonated frequency of the SAW resonator is in the range from a few tens of MHz to several GHz. By using the SAW resonator, a radio-frequency signal can be obtained directly. This circuit is illustrated in FIG. 7($b$).

In such a circuit comprising the above-described SAW resonator, the characteristics of the SAW resonator dominate the characteristics of the output signal. However, the SAW resonator has frequency-temperature characteristics such that the resonance frequency varies according to the variation of the ambient temperature. Further, the SAW resonator has a characteristic such that the resonance frequency varies according to fluctuations in power-supply voltage supplied to the circuit and a secular variation. Therefore, the frequency stability of the output signal of the circuit comprising the above-described SAW resonator is decreased by temperature or the like.

To this end, a temperature-compensated circuit comprising a variable capacity diode or the like can be provided separately for providing temperature compensation for the SAW resonator. However, since this method is effective only for the temperature compensation, the frequency stability cannot be raised.

For solving such problems, the object of the present invention is to provide a temperature-compensated radio-frequency oscillator formed as an oscillator using a SAW resonator that achieves high frequency stability and can output a clock signal having a frequency that is constant over a wide temperature range. Another object of the present invention is to provide a communication device using the temperature-compensated radio-frequency oscillator.

SUMMARY OF THE INVENTION

The configuration of the temperature-compensated radio-frequency oscillator provided for solving the above-described problems according to the present invention is described below.

The temperature-compensated radio-frequency oscillator is an oscillator for oscillating a SAW resonator, comprising:

a voltage-controlled SAW oscillator that outputs a signal at a frequency that is changed according to a supplied control voltage, a temperature-compensated oscillator that outputs a signal at a constant frequency independent of the ambient temperature, a frequency divider that divides the output signal of the voltage-controlled SAW oscillator, a phase comparator that compares the phase of the output signal of the frequency divider with the phase of the output signal of the temperature-compensated oscillator and outputs a phase difference signal according to the comparison result, and a low-pass filter for smoothing the phase difference signal, wherein a phase locked loop is formed by supplying the output signal of the low-pass filter to the voltage-controlled SAW oscillator as the control voltage, and wherein the oscillation output of the voltage-controlled SAW oscillator is output to the outside.

According to the above-described configuration, the voltage-controlled oscillator outputs a signal at a frequency according to a supplied controlled voltage, and the temperature-compensated oscillator outputs a signal at a constant frequency independent of the ambient temperature. Then, the phase-comparator outputs the phase-difference signal according to the phase difference between the signals output from these circuits. The low-pass filter smoothes the phase-difference signal and outputs the smoothed phase-difference signal to the voltage-controlled SAW oscillator as a control signal. Thus, the temperature-compensated radio-frequency oscillator is formed as a PLL circuit. Therefore, the frequency of the signal output from the voltage-controlled SAW oscillator is kept constant even though the ambient temperature varies.

Preferably, a temperature-compensated crystal oscillator (TCXO) using a crystal AT resonator is used for the temperature-compensated oscillator. By using the TCXO, a high performance, compact temperature-compensated oscillator can be provided at lower cost.

The configuration of the temperature-compensated radio-frequency oscillator according to the present invention is described below.

The temperature-compensated radio-frequency oscillator is an oscillator for oscillating a SAW resonator, comprising:

a voltage-controlled SAW oscillator that outputs a signal at a frequency that is changed according to a supplied control voltage, a temperature-compensated oscillator that outputs a signal at a constant frequency independent of the ambient temperature, a frequency divider that divides the output signal of the voltage-controlled SAW oscillator, a phase comparator that compares the phase of the output signal of the frequency divider with the phase of the output signal of the temperature-compensated oscillator and outputs a phase difference signal according to the comparison result, and a DSP (Digital Signal Processor) for generating a signal corresponding to the phase difference signal, wherein a phase locked loop is formed by supplying the signal generated by the DSP to the voltage-controlled SAW oscillator as the control signal, and wherein the oscillation output of the voltage-controlled SAW oscillator is output to the outside.

According to the configuration, in the phase locked loop, it becomes possible to integrate a low-pass filter (a loop filter) into an IC. Therefore, the size of the circuit is reduced and the resistance to external noise is increased.

The above-described temperature-compensated radio-frequency oscillators that are formed according to the above-described configurations can be provided in a communication device.

BRIEF DESCRIPTION OF THE DRAWINGS

FIG. 5(*a*) illustrates the circuit configuration around a phase comparator 2 of the temperature-compensated radio-frequency oscillator 100.

FIG. 5(*b*) illustrates the circuit configuration around a DSP 301 of the temperature-compensated radio-frequency oscillator 200.

FIG. 7(*a*) illustrates a related art.

FIG. 7(*b*) illustrates another related art.

DETAILED DESCRIPTION OF THE PREFERRED EMBODIMENTS

The preferred embodiments of the present invention will now be described with reference to the drawings.

A: First Embodiment

Figure 1:
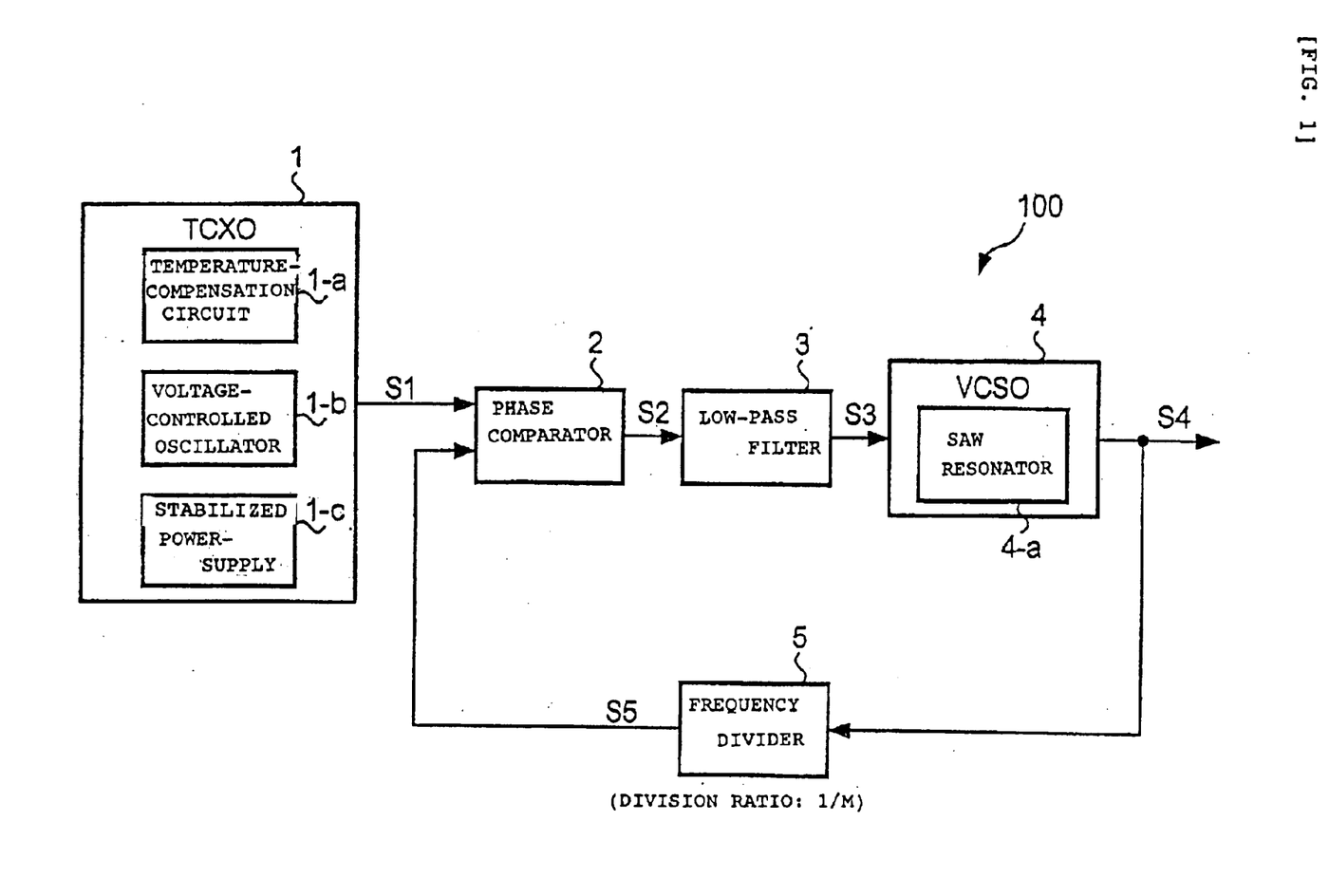
FIG. 1 illustrates the configuration of a temperature-compensated radio-frequency oscillator 100 according to a first embodiment of the present invention.

FIG. 1 is a block diagram illustrating the configuration of a temperature-compensated radio-frequency oscillator 100 according to a first embodiment of the present invention.

As shown in FIG. 1, the temperature-compensated radio-frequency oscillator 100 comprises a temperature-compensated crystal oscillator 1 (hereinafter referred to as a TCXO 1), a phase comparator 2, a low-pass filter 3, a voltage-controlled SAW oscillator 4 (hereinafter referred to as a VCSO 4), and a frequency divider 5.

The TCXO 1 outputs a clock signal S1 of a constant frequency in the range from several MHz to a few tens of MHz over a wide temperature range including the practical temperature range of the temperature-compensated radio-frequency oscillator 100. The TCXO 1 comprises a temperature-compensation circuit 1-*a*, a voltage-controlled oscillator 1-*b*, and a stabilized power-supply 1-*c*.

The temperature-compensation circuit 1-*a* outputs a signal Stmp of a voltage level suitable for providing temperature compensation for the frequency-temperature characteristics of a piezoelectric oscillator of the voltage-controlled oscillator 1-*b* corresponding to the ambient temperature of the temperature-compensated radio-frequency oscillator 100.

The voltage-controlled oscillator 1-*b* comprises a crystal resonator and outputs a clock signal S1 at a frequency according to the voltage level of the signal Stmp output from the temperature-compensation circuit 1-*a*. The stabilized power-supply 1-*c* supplies stable power to the voltage-controlled oscillator 1-*b*. Therefore, the voltage-controlled oscillator 1-*b* can output the clock signal S1 at a stable frequency. Preferably, a crystal AT resonator is used as the above-described piezoelectric resonator. Such a TCXO outputs an oscillation frequency from a several to a few tens of MHz. Since mobile phones have become widely available in recent years, high precision, compact TCXOs are available at low cost.

The frequency divider 5 outputs a frequency division signal S5 by dividing the frequency of a clock signal S4 output from the VCSO 4. Incidentally, the frequency division rate 1/M of the frequency divider 5 is set so that the frequency of the frequency division signal S5 becomes equivalent to the frequency of the clock signal S1 that is output from the TCXO 1 in reference temperature (e.g., 25).

The phase comparator 2 outputs a phase-difference signal S2 corresponding to the phase difference obtained by comparing the clock signal S1 that is output from the TCXO 1 with the frequency division signal S5 that is output from the frequency divider 5.

The low-pass filter 3 smoothes the phase-difference signal S2 that is output from the phase comparator 2 and outputs the smoothed signal to the VCSO 4 as a control signal S3. More specifically, the low-pass filter 3 performs processing for outputting a signal corresponding to the average signal level of the phase-difference signal S2 to the VCSO 4 as the control signal S3.

The details of the operation of the phase comparator 2 and the low-pass filter 3 will now be described with reference to FIGS. 2 and 3.

First, the phase comparator 2 outputs a pulse signal SP as the signal S2. The pulse signal SP has a width that corresponds to the period from the rising edge (or the falling edge) of the clock signal S1 to the rising edge (or the falling edge) of the frequency-division signal S5. The low-pass filter 3 smoothes the pulse signal SP (the signal S2) and outputs a signal of the average voltage level of the pulse signal SP as the control signal S3.

Figure 2:
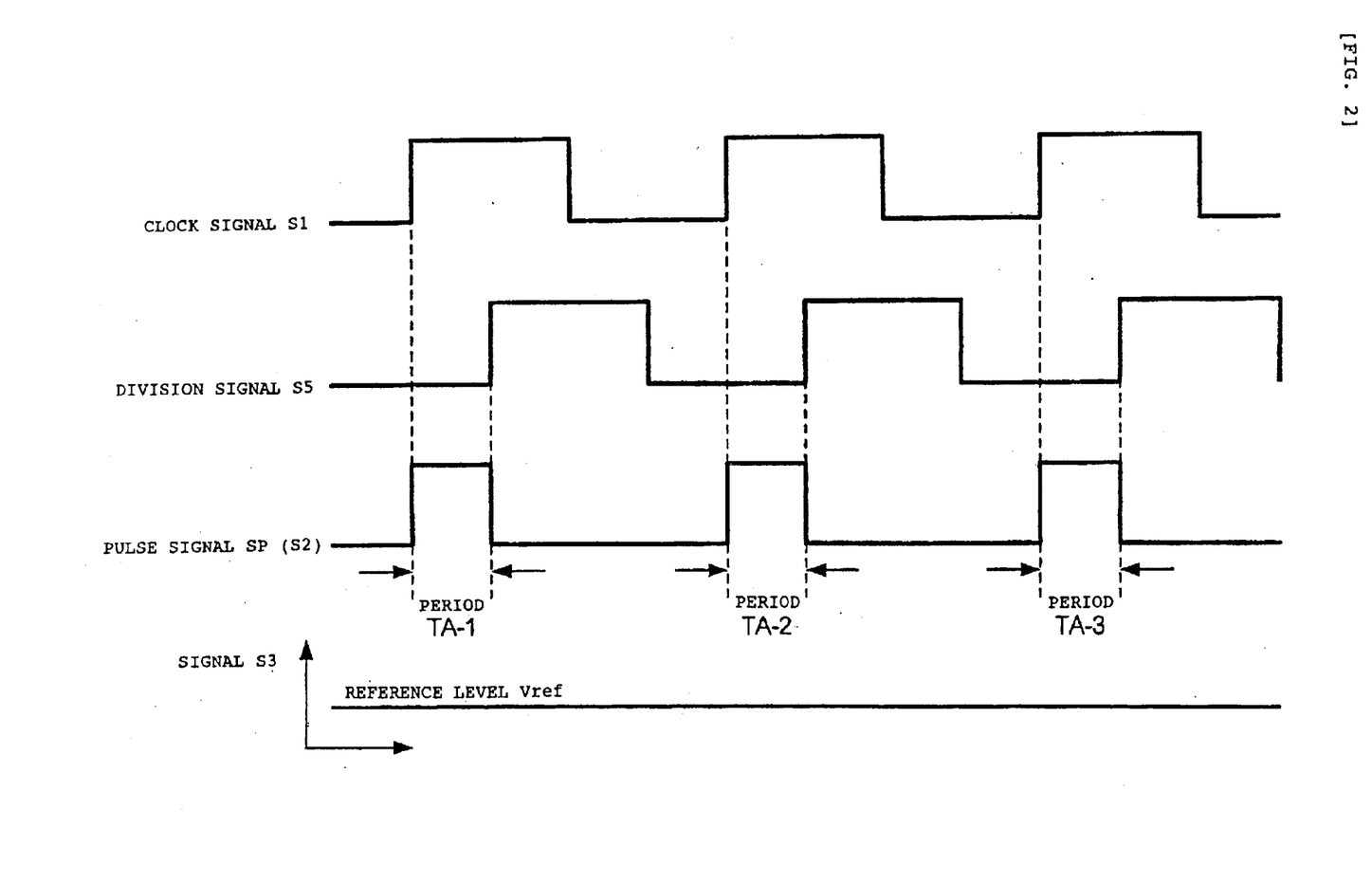
FIG. 2 illustrates the details of the operation of a phase comparator 2 of the temperature-compensated radio-frequency oscillator 100.

Accordingly, when the frequencies of the signal S1 and the signal S5 become equivalent and the time intervals of high-level periods TA-1, TA-2, TA-3, and so forth of the pulse signal SP are the same as shown in FIG. 2, the low-pass filter 3 outputs the control signal S3 of the voltage level (a reference voltage level Vref) indicating that the phase difference between the signal S1 and the signal S5 is constant.

Figure 3:
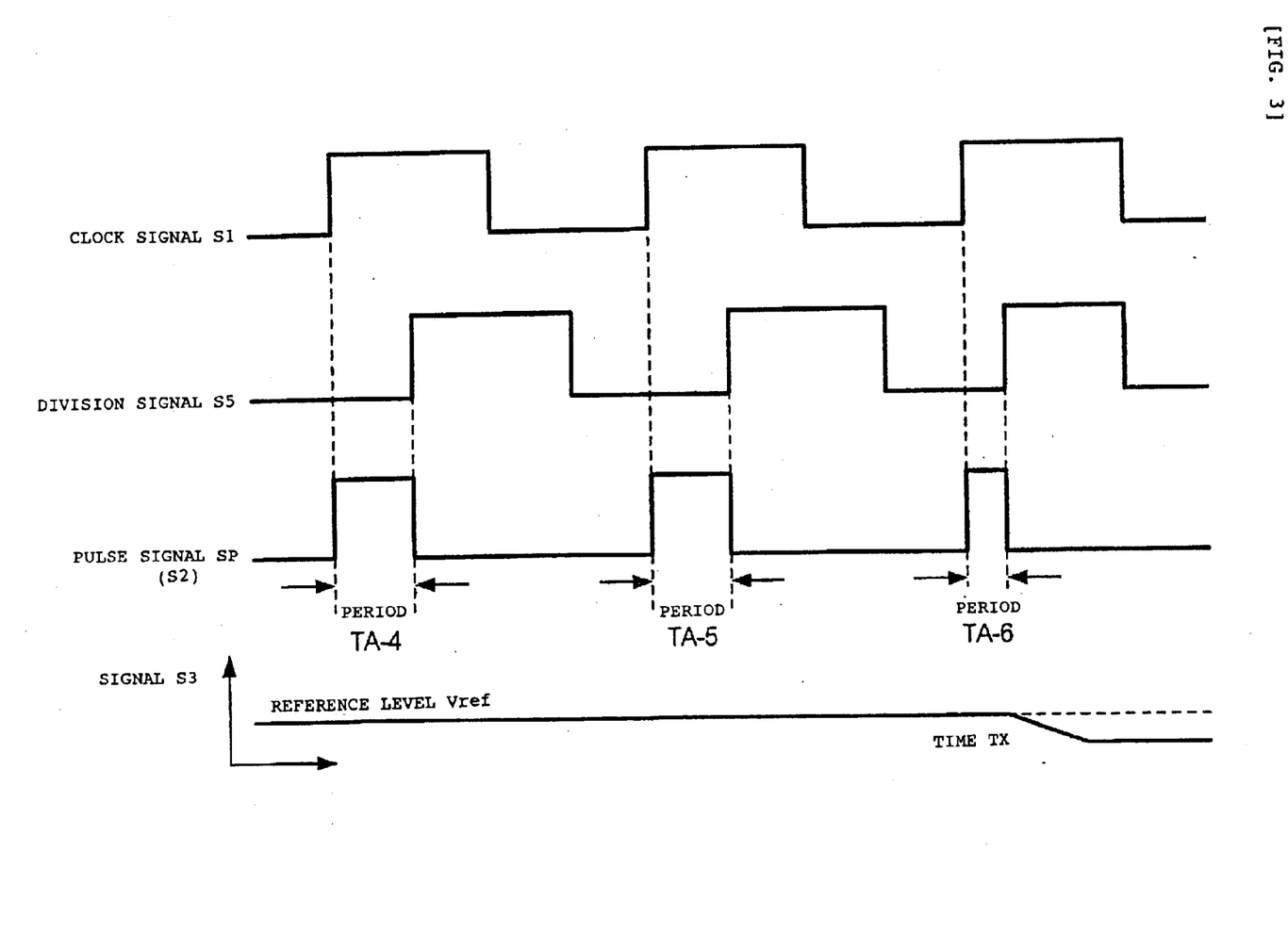
FIG. 3 illustrates the details of the operation of the phase comparator 2 of the temperature-compensated radio-frequency oscillator 100.

On the other hand, as shown in FIG. 3, when the frequency of the frequency-division signal S5 varies at a time TX, the values of the high-level periods TA-4 and TA-5 of the pulse signal S2 are the same. However, the value of a measured time TA-6 becomes different. In such a case, after the time TX, the low-pass filter 3 outputs the control signal S3 of the voltage level according to the phase difference between the signal S1 and the signal S5 (the level different from the reference voltage level Vref).

Thus, the low-pass filter 3 outputs the control signal S3 whose voltage level changes centering on the reference voltage level Vref according to the phase difference between the clock signal S1 and the frequency-division signal S5.

The voltage-controlled SAW oscillator (VCSO) 4 is a voltage-controlled oscillator for oscillating a SAW resonator 4-a. This circuit 4 outputs a clock signal S4 whose frequency changes in the range from several hundred MHz to several GHz in proportion to the voltage level of the control signal S3.

Thus, the temperature-compensated radio-frequency oscillator 100 forms a phase locked loop (PLL) circuit.

The details of the operation according to the embodiment will now be described.

In the temperature-compensated radio-frequency oscillator 100, the phase comparator 2 compares the phase of the clock signal S1 of the TCXO 1 to the phase of the frequency-division signal S5 of the frequency divider 5. The frequency-division signal S5 is obtained by dividing the frequency output S4 of the VCSO 4 by M.

The phase comparator 2 outputs the signal S2 according to the phase-comparison result. The output signal S2 is output to the VCSO 4 as the control signal S3 that has been smoothed by the low-pass filter 3. The voltage level of the control signal S3 corresponds to the average voltage level of the signal S2.

When the frequencies of the signal S1 and the signal S5 are the same and the phase difference is constant, the phase comparator 2 outputs the control signal S3 having the reference voltage level Vref to the VCSO 4. The VCSO 4 outputs the clock signal S4 at a frequency corresponding to the voltage level (the reference voltage level Vref in this case) of the control signal S3. Thus, when the phases of the signal S1 and the signal S5 are the same, the clock signal S1 with a constant frequency for which temperature compensation was provided is maintained (locked) so that it coincides with the phase of the frequency-division signal S5 obtained by dividing the clock signal S4. Subsequently, the VCSO 4 continuously outputs the constant-frequency clock signal S4 obtained by multiplying the frequency of the clock signal S1 by M.

As the ambient temperature changes, the SAW resonator 4-a having frequency-temperature characteristics changes the frequency of the clock signal S4 of the VCSO 4, in turn, the frequency of the frequency-division signal S5. Subsequently, the phases of the signal S1 and the signal S5 become different. In such a case, the phase comparator 2 outputs the phase-difference signal S2 according to the phase difference between the signal S1 and the signal S5. The phase-difference signal S2 is smoothed by the low-pass filter 3 and is output to the VCSO 4 as the control signal S3 of a predetermined voltage level (a level different from the reference value Vref). The VCSO 4 outputs the clock signal S4 at a frequency corresponding to the voltage level of the control signal S3, thereby controlling the frequency of the clock signal S4 so that the phase difference between the clock signal S1 and the frequency-division signal S5 is reduced. Thus, the phase locked loop of the temperature-compensated oscillator 100 operates so that the phase difference between the signal S5 and the signal S1 becomes constant immediately even though the phases of the signal S1 and the signal S5 become different according to the change of the ambient temperature. Accordingly, the VCSO 4 can continuously output the constant-frequency clock signal S4 obtained by multiplying the frequency of the clock signal S1 by M.

As has been described, the temperature-compensated radio-frequency oscillator 100 forms the PLL circuit comprising the TCXO 1, the phase comparator 2, the low-pass filter 3, the VCSO 4, and the frequency divider 5. Therefore, even though the ambient temperature changes, the radio frequency of the clock signal S4 that is output from the VCSO 4 can be maintained constant.

As the power voltage supplied to the temperature-compensated radio-frequency oscillator 100 is changed, the power voltage supplied to the VCSO 4 is changed. Subsequently, the frequency of the clock signal S4 that is output from the VCSO 4 is changed. However, since the TCXO 1 has the stabilized power-supply 1-c, the frequency of the clock signal S1 that is output from the TCXO 1 is not changed even though the power voltage is changed.

Thus, when the frequency of the clock signal S4 of the VCSO 4 and the frequency of the frequency-division signal S5 are changed according to the change of the power voltage, the phase comparator 2 outputs the phase-difference signal S2 according to the phase difference between the frequency-division signal S5 and the clock signal S1. The signal S2 is smoothed by the low-pass filter 3 and is output to the VCSO 4 as the control signal S3 of a voltage level (a level different from the reference value Vref). The VCSO 4 outputs the clock signal S4 at the frequency corresponding to the voltage level of the control signal S3. Subsequently, the frequency of the clock signal S4 is controlled so that the phase difference between the clock signal S1 and the frequency-division signal S5 is reduced.

Thus, even though the frequency of the clock signal S4 is changed according to the change of the power voltage, the frequency of the clock signal S4 is immediately restored with reference to the clock signal S1 whose frequency is constant. Subsequently, the VCSO4 can continuously output the constant-frequency clock signal S4 obtained by multiplying the frequency of the clock signal S1 by M.

Generally, an aging (The characteristic changes with passage of time) of the TCXO 1 is small compared with a aging of the VCSO 4. Therefore, even though the frequency of the clock signal S4 is changed due to an aging, the frequency of the clock signal S4 is immediately restored with reference to the clock signal S1 whose frequency is not changed due to an aging. Subsequently, the VCSO4 continuously outputs the constant-frequency clock signal S4 obtained by multiplying the frequency of the clock signal S1 by M. That is to say, the TCXO 1 corrects an aging of the VCSO 4.

As has been described, the temperature-compensated radio-frequency oscillator 100 according to the embodiment of the present invention is formed by the PLL circuit comprising the VCSO 4 and the TCXO 1 having higher precision and stability than the VCSO 4. Therefore, the precision and the stability of the frequency of the clock signal S4 are increased. The temperature-compensated radio-frequency oscillator 100 can achieve high frequency stability in the frequency band from several hundred MHz to a few GHz. When the temperature-compensated radio-frequency oscillator 100 is mounted on a communication device, high-capacity data communications can be performed by using a radio frequency without problems.

B: A Second Embodiment

Figure 4:
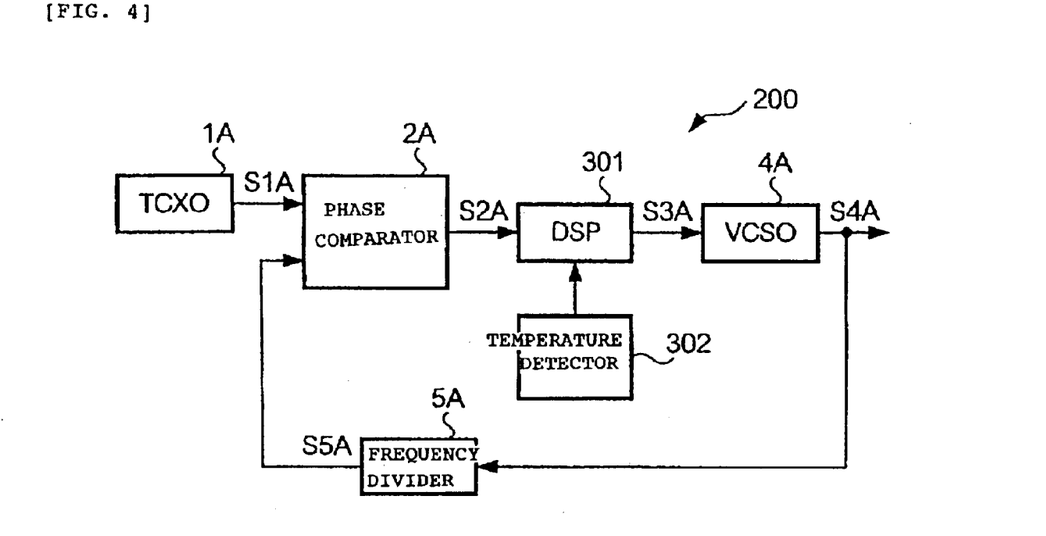
FIG. 4 illustrates the configuration of a temperature-compensated radio-frequency oscillator 200 according to a second embodiment of the present invention.

FIG. 4 schematically illustrates the configuration of a temperature-compensated radio-frequency oscillator 200 according to a second embodiment. Unlike the temperature-compensated radio-frequency oscillator 100 according to the first embodiment, the temperature-compensated radio-frequency oscillator 200 comprises a DSP (Digital Signal Processor) 301 instead of the low-pass filter 3. The DSP 301 receives the phase difference signal S2 that is output from the phase comparator 2, outputs a control voltage S3A obtained by calculation, and controls the VCSO 4 according to the control voltage S3A.

The low-pass filter 3 according to the first embodiment usually comprises an analog filter. However, it is difficult to implement a common analog filter in chip form. Therefore, it becomes difficult to reduce the size of the circuit substrate thereof. Further, such an analog filter is a high-impedance circuit and is susceptible to external noise. When using the communication device that employs the present invention, there are various kinds of radio-frequency noise around the communication device, which causes a serious problem for the communication device, which is susceptible to such external noise. Further, a PLL circuit of the same kind is often provided around the communication device. Therefore, the PLL circuit is susceptible to mutual interference.

In this embodiment, the DSP 301 is used instead of the low-pass filter 3. Therefore, it becomes possible to integrate the low-pass filter 3 of the first embodiment into an IC. Since the low-pass filter 3 is implemented in the chip form, the communication device becomes compact. Also, the resistance of the communication device to external noise is increased so that the communication device becomes less susceptible to external noise.

Figure 5:
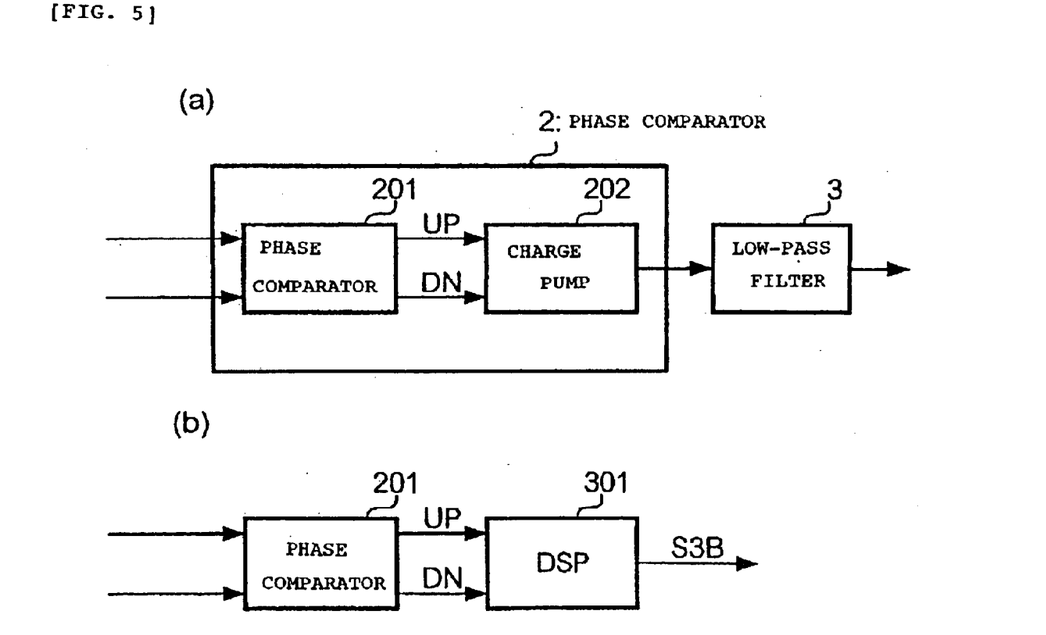

In the first embodiment, the low-pass filter 3 is connected to the phase comparator 2 comprising a phase comparator 201 and a charge pump 202 as shown in FIG. 5(*a*). In the second embodiment, however, the circuit configuration is not limited to the configuration shown in FIG. 4. The circuit configuration where the low-pass filter 3 is connected to the phase comparator 2 may be replaced with a configuration where the DSP 301 is connected to the phase comparator 201 as shown in FIG. 5(*b*). In such a case, the DSP 301 outputs the analog operation of the charge pump 202 and the low-pass filter 3 as the control voltage S3B that is obtained by digital calculation upon receiving the phase difference signal from the phase comparator 201, thereby controlling the VCSO 4.

C: Modification

Thus, the embodiments of the present invention have been described. However, these embodiments are only examples that can be modified without departing from the spirit and the scope of the present invention.

For example, the present invention can be used for a communication device comprising the temperature-compensated radio-frequency oscillator 100, or the temperature-compensated radio-frequency oscillator 200 according to the above-described embodiments.

Figure 6:
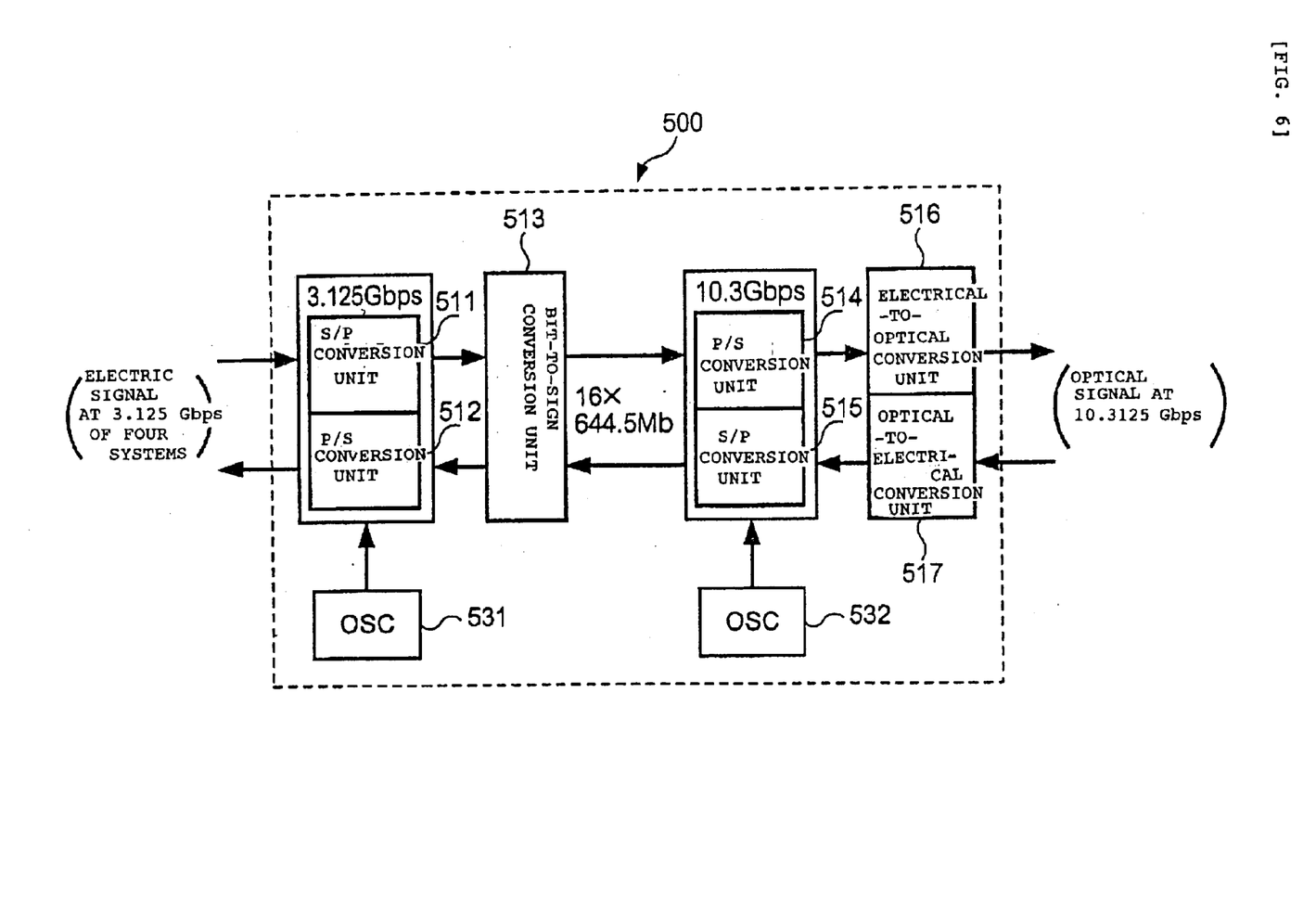
FIG. 6 illustrates an exemplary modification of the present invention.

FIG. 6 illustrates the schematic configuration of an optical interface module 500 using an oscillator according to the present invention. The optical interface module 500 performs signal conversion for an optical signal and an electrical signal for receiving and transmitting data via an optical network. For example, the optical interface module 500 performs signal conversion for an optical signal at 10.3125 Gbps and an electrical signal at 3.125 Gbps (four systems).

An electrical-to-optical conversion unit 516 converts an electrical signal that is output from a P/S (parallel/serial) conversion unit 514 to an optical signal and outputs the optical signal to the optical network. An optical-to-electrical conversion unit 517 converts an optical signal that is output from the optical network to an electrical signal and outputs the electrical signal to an S/P (serial/parallel) conversion unit 515.

Oscillators 531 and 532 each comprise the temperature-compensated radio-frequency oscillator 100 according to the present invention (or the temperature-compensated radio-frequency oscillator 200) and output a clock signal at a frequency that is constant independent of the ambient temperature. The clock signal is used as the reference signal for an S/P conversion unit 511 and a P/S conversion unit 512 at 3.215 Gbps and the P/S conversion unit 514 and the S/P conversion unit 515 at 10.3125 Gbps that are interconnected via a bit-to-sign conversion unit 513.

Thus, by using the temperature-compensated radio-frequency oscillator 100 (or the temperature-compensated radio-frequency oscillator 200) according to the present invention, the optical interface module 500 can achieve an optical network that can receive and transmit data with stability irrespective of the ambient temperature.

As has been described, the present invention can provide the temperature-compensated radio-frequency oscillator formed as the oscillator using the SAW resonator that achieves the high frequency stability and outputs the clock signal at the frequency that is constant over the wide temperature range. The entire disclosure of Japanese Patent Application Nos. 2001-333356 filed Oct. 30, 2001 and 2002-194994 filed Jul. 3, 2002 are incorporated by reference.

What is claimed is:

1. A temperature-compensated radio-frequency oscillator for oscillating a SAW resonator, comprising:
    a voltage-controlled SAW oscillator that outputs an output signal at a frequency that is changed according to a supplied control voltage;
    a temperature-compensated oscillator that outputs an output signal at a constant frequency independent of ambient temperature;
    a frequency divider that divides the output signal of the voltage-controlled SAW oscillator;
    a phase comparator that compares the phase of the output signal of the frequency divider with the phase of the output signal of the temperature-compensated oscillator and outputs a phase difference signal according to the comparison result; and
    a Digital Signal Processor that generates a signal corresponding to the phase difference signal,
    wherein a phase locked loop is formed by supplying the signal generated by the Digital Signal Processor to the voltage-controlled SAW oscillator as the control signal, and
    wherein the oscillation output of the voltage-controlled SAW oscillator is output.

2. A temperature-compensated radio-frequency oscillator according to claim 1, wherein the temperature-compensated oscillator is a temperature-compensated crystal oscillator using a crystal AT resonator.

3. A temperature-compensated radio-frequency oscillator according to claim 1, wherein the SAW resonator is a crystal SAW resonator.

4. A temperature-compensated radio-frequency oscillator according to claim 2, wherein the SAW resonator is a crystal SAW resonator.

5. A communication device comprising the temperature-compensated radio-frequency oscillator according to claim 1.

6. A communication device comprising the temperature-compensated radio-frequency oscillator according to claim 2.

7. A communication device comprising the temperature-compensated radio-frequency oscillator according to claim 3.

8. A communication device comprising the temperature-compensated radio-frequency oscillator according to claim 4.

* * * * *